(12) United States Patent
Loiseau et al.

(10) Patent No.: US 9,978,743 B1
(45) Date of Patent: May 22, 2018

(54) VOLTAGE BALANCED STACKED CLAMP

(71) Applicant: International Business Machines Corporation, Armonk, NY (US)

(72) Inventors: Alain F. Loiseau, Williston, VT (US); Steven W. Mittl, Essex Junction, VT (US); Andreas D. Stricker, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/713,731

(22) Filed: Sep. 25, 2017

Related U.S. Application Data

(63) Continuation of application No. 15/444,519, filed on Feb. 28, 2017.

(51) Int. Cl.
*H02H 9/00* (2006.01)
*H01L 27/02* (2006.01)
(Continued)

(52) U.S. Cl.
CPC ........... *H01L 27/0288* (2013.01); *H03K 5/08* (2013.01); *H03K 19/0948* (2013.01)

(58) Field of Classification Search
CPC .. H03K 19/0948; H03K 5/08; H01L 27/0248; H01L 27/0251; H01L 27/0255; H01L 27/0259; H01L 27/0262; H01L 27/0266; H01L 27/027; H01L 27/0274; H01L 27/0277; H01L 27/0281; H01L 27/0285; H01L 27/0288; H01L 27/0292; H01L 27/0296; H02H 9/00; H02H 9/02; H02H 9/04; H02H 9/06; H02H 9/08; H02H 9/041; H02H 9/042; H02H 9/043; H02H 9/044; H02H 9/045; H02H 9/046; H02H 9/047; H02H 1/00; H02H 1/04; H02H 1/06
(Continued)

(56) References Cited

U.S. PATENT DOCUMENTS 6,157,530 A * 12/2000 Pequignot ........... H01L 27/0248
361/111
7,483,247 B2 1/2009 Poon et al.
(Continued)

FOREIGN PATENT DOCUMENTS

| EP | 2194578 A1 | 9/2010 |
|---|---|---|
| WO | 2006039624 A1 | 4/2006 |
| WO | 2008130891 A1 | 10/2008 |

OTHER PUBLICATIONS

Cao et al., "Novel Active ESD Clamps for High-Voltage Applications", IEEE Transactions on Device and Materials Reliability, vol. 13, No. 2, Jun. 2013, © 2013 IEEE, pp. 388-397.
(Continued)

*Primary Examiner* — Patrick Chen
(74) *Attorney, Agent, or Firm* — Monchai Chuaychoo

(57) ABSTRACT

Embodiments of the present invention provide methods for balancing voltages during voltage division. More specifically, circuit performance is enhanced (i) balancing out the voltage drops across two field effect transistors (FETs); (ii) powering inverters through a voltage divider containing two voltage input pins during normal operation of the circuit; and (iii) powering inverters through a FET during electrostatic discharge.

1 Claim, 8 Drawing Sheets

(51) Int. Cl.
*H03K 19/0948* (2006.01)
*H03K 5/08* (2006.01)

(58) Field of Classification Search
USPC .......................................... 327/310
See application file for complete search history.

(56) References Cited

U.S. PATENT DOCUMENTS

| 7,495,873 | B2* | 2/2009 | Bhattacharya ...... H01L 27/0266 |
| | | | 361/56 |
| 7,782,580 | B2 | 8/2010 | Gauthier, Jr. et al. |
| 2007/0171587 | A1* | 7/2007 | Lee .................... H01L 27/0285 |
| | | | 361/56 |
| 2008/0049365 | A1 | 2/2008 | Worley et al. |
| 2009/0086391 | A1 | 4/2009 | Gauthier et al. |
| 2009/0089719 | A1 | 4/2009 | Gauthier, Jr. et al. |
| 2010/0027173 | A1 | 2/2010 | Wijmeersch |
| 2012/0305984 | A1 | 12/2012 | Campi, Jr. et al. |
| 2013/0182359 | A1 | 7/2013 | Jeon et al. |

OTHER PUBLICATIONS

Maloney et al., "Stacked PMOS clamps for high voltage power supply protection", EOS/ESD Symposium 99-76, 8 pages.

Smith et al., "A MOSFET power supply clamp with feedback enhanced triggering for ESD protection in advanced CMOS technologies", Elsevier, Science Direct, © 2004 Elsevier Ltd., doi:10.1016/j.microrel.2004.05.008, Microelectronics Reliability 45 (2005) 201-210.

Loiseau et al. "Voltage Balanced Stacked Clamp", U.S. Appl. No. 15/444,519, filed Feb. 28, 2017, 30 pages.

Appendix P—List of IBM Patents or Patent Applications Treated as Related, Filed herewith, 2 Pages.

* cited by examiner

VOLTAGE BALANCED STACKED CLAMP

BACKGROUND OF THE INVENTION

The present invention relates generally to transistor technology, and more specifically to controlling voltage of a stacked power clamp.

When an excess of electric charge, which is stored on an electrically insulated structure, electrostatic discharge (ESD) is a momentary and sudden electric current that finds a path to another structure at a different electrical potential. ESD events may lead to irreparable damage to an integrated circuit (IC). A clamping circuit structure, such as a RC clamp, are incorporated into the IC in order to protect against ESD. More specifically, the RC clamp provides ESD protection to the terminals which receive an operating voltage for driving an IC chip, or portions thereof. The RC clamp ensures that a sudden surge in voltage from an ESD event can be safely discharged without damaging the IC. The RC clamp, while holding the voltage across the power supply terminals to the power supply voltage, requires one or more relatively large field-effect transistors, or "Big-FETs," capable of discharging the electrical current produced from an ESD event.

SUMMARY

According to an embodiment of the present invention, a method for balancing voltage is provided. The method comprises: receiving a total voltage from a voltage supply pin; dividing the total voltage into two different voltages, wherein: a first voltage is greater than half of the total voltage, and a second voltage is less than or equal to half of the total voltage; sending the first voltage to a group of inverters of a first layer and an n-type channel field effect transistor (NFET) of the first layer, wherein the group of inventors of the first layer consists of: a first inverter, a second inverter, and a third inverter; sending the second voltage to a decoupling resistor, and a group of inventors of a second layer, and an NFET of the second layer, wherein the group of inventors of the second layer consists of: a first inverter, a second inverter, and a third inverter; responsive to sending the first voltage and the second voltage, powering the first inverter, the second inverter, and the third inverter of the second layer through the decoupling resistor during a typical operation of a circuit; monitoring for an electric static discharge (ESD) event; responsive to detecting an ESD event powering the first inverter, the second inverter, and the third inverter of the second layer through a first p-type channel field effect transistor (PFET) during the ESD event; and generating a third voltage at a midpoint node, wherein the third voltage is half of the total voltage during the ESD event and wherein the midpoint node is a common region shared between the NFET of the first layer and the NFET of the second layer.

DETAILED DESCRIPTION

Regular RC clamps are commonly utilized in conjunction with ICs, but can only protect power supplies up to the voltage rating of the field-effect transistors (FETs). Stacking two FETs in RC clamps may double the voltage rating of the stacked FETS. In the stacked setup, if the top FET and the bottom FET have different applied gate substrate voltages ($V_{gb}$), then the threshold voltages ($V_{ts}$) of the top FET and the bottom FET are offset. Thus, the voltages do not divide equally between the top FET and the bottom FET, which causes extra voltage stress on either the top FET or the bottom FET and reduces the lifetime of the integrated circuit. In order to alleviate these undesired effects, embodiments of this invention disclose solutions to perform at least the following functions: (i) balancing out the voltage drops across two FETs; (ii) powering inverters through a voltage divider containing two voltage input pins during the normal operation of the IC; and (iii) powering inverters through a FET during ESD. As described in greater detail below, embodiments of the present invention provide solutions that include a voltage divider that transfers two different voltages in a dually stacked RC clamp.

Figure 1:
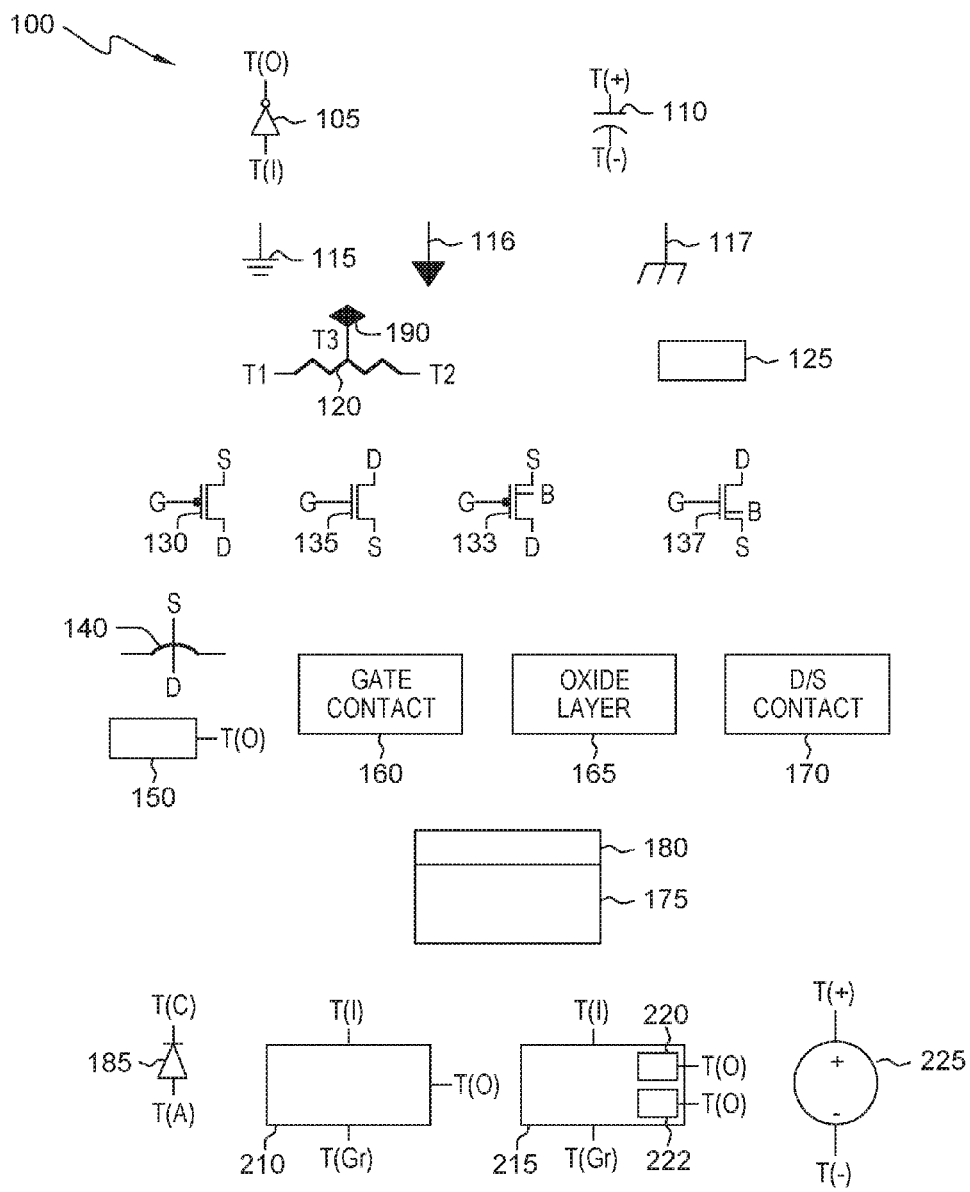
FIG. 1, is an illustration of electronic components and transistor structures, in accordance with an embodiment of the present invention.

The present invention will now be described in detail with reference to the Figures. FIG. 1 is a block diagram of integrated circuit components 100, in accordance with an embodiment of the present invention. FIG. 1 provides only an illustration of implementation of electronic component devices used in a computing environment and does not imply any limitations with regard to the environments in which different embodiments may be implemented.

Integrated circuit components 100 depicts block diagrams of electronic components devices necessary to implement the methods and systems as disclosed by the embodiments of the present invention. Additional types of electronic component devices may be used without departing from the scope of the invention as recited by the claims. The electronic components, depicted in FIG. 1, are arranged in particular configurations in conjunction with other wires, voltage sources, data sources, etc., in order to: (i) balance out the voltage drops across two FETs; (ii) power inverters through a voltage divider containing two voltage input pins during the normal operation of the IC; and (iii) power inverters through a FET during ESD.

The components that are incorporated in the embodiments of the present invention include at least the following: wires, invertors; capacitors; polarized capacitors; earth ground power-supply pins; digital/common ground power-supply pins; chassis ground power-supply pins; resistors; variable resistor connected to a potentiometer; voltage power supply pins for FETs; n-channel metal-oxide semiconductor FETs (NMOS-FETs); p-channel metal oxide semiconductor FETs (PMOS-FETs); gate contacts; insulating oxides; drain/source contacts; p-well surfaces; silicon surfaces; diodes; potentiometers; voltage dividers; and voltage inputs; and voltage sources. The details pertaining to the configured arrangements of these electronic components will be discussed in more detail with respect to FIGS. 2-9.

As shown herein, a wire is depicted using a straight line which is connected to at least one terminal of an electronic component. In this embodiment, principal nodes or junctions are points where 3 or more wires intersect one another. These principal nodes or junctions are depicted as darkened circles labeled as N1, N2, N3, and so forth. A branch node as used herein, is a point of intersection (e.g., where two lines intersect/connect) connected to a principal node and a terminal of an electronic component.

Inverter 105 is a digital logic gate, which contains two terminals—T(I) and T(O). These terminals may be connected to data inputs, other wires, other electronic components, and/or devices. Complimentary metal-oxide semiconductor field-effect transistors (CMOS); resistors; and/or bipolar junction transistors in resistor-transistor logic configuration or transistor-logic configuration are used to make inverter 105. Inverter 105 may also be described as a p-type MOSFET attached to a n-type MOSFET, which is referred to as CMOS.

Polarized capacitor 110 is an electronic component which contains two terminals and stores electrical charge. Two conducting plates are separated by an insulator in polarized capacitor 110. The ability to store electrical charge (i.e., capacitance) increases as separation between the two conducting plates decreases. The dielectric material (e.g., ceramics and paper) also influences the ability to store electrical charge. Polarized capacitor 110 is a fixed value capacitor in that it is able to maintain a capacitance value, as opposed to variable capacitors. Polarized capacitor 110 is a polarized component containing a positively charged terminal (e.g., T(+)) and a negatively charged terminal (e.g., T(−)).

Earth ground 115, digital/common ground 116, and chassis ground 117 are devices which ground voltages. Signal grounds serve as return paths for signals and power within equipment and on signal interconnections between equipment. Voltage is the difference in electric potential energy between two points per unit of electric charge. Voltage can only be measured in terms of differences. In order to measure a given point, a reference point must be selected to measure against. These ground voltages are treated as the reference points, which are given a voltage of 0.0 Volts.

Resistor 120 is an electronic component used to reduce current flow, adjust signal levels, divide voltages, bias active elements, terminate transmission lines, etc. Electrical resistance is a measure of the difficulty needed to pass an electric current through a component as a ratio of the voltage across the component to the current through the component. In this embodiment, resistor 120 includes: two terminals—T1 and T2; and (ii) electrical resistances which change slightly with time, temperature, or operating voltage. In other words, the electrical resistance of resistor 120 is fixed over time, temperature, or operating voltage. In some embodiments of resistor 120, a third terminal (as denoted by T3 in the drawings) is depicted as being attached in order to represent resistor 120 is sensitive to the voltage applied to the environment around resistor 120. This is not to be construed as being representative of a variable resistor. The third terminal is connected to well 190, wherein well 190 is a polysilicon surface residing underneath the "active resistor region" of resistor 120.

Vdd 125 is a voltage power supply pin directed towards FETs, which provides positive supply voltage in instances of n-channel MOS-FETs. In other words, Vdd 125 provides voltage to FETs in order to power a circuit.

PMOS-FET 130 is a type of metal-oxide semiconductor field-effect transistor (MOSFET) used for amplifying and switch electronic signals. More specifically, PMOS-FET 130 is a p-channel MOSFET and thus uses holes (as opposed to electrons) for conduction. PMOS-FET 130 is a device containing three terminals connected to data inputs, other wires, other electronic components, and/or devices. These three terminals are: a gate terminal (G); a source terminal (S); and a drain terminal (D). Drain-to-source current flows (via an induced conducting channel) connects the source terminal to the drain terminal. The conductivity is varied by the electric field that is produced when a voltage is applied between the gate terminal and the drain terminal. The gate terminal is attached to a polysilicon surface. The source and drain terminals are connected to a silicon oxide surface using heavily doped p-type material (i.e., holes/electron deficient carriers to facilitate conduction). Electric currents leave the source terminal and gate terminal and arrive into the drain terminal.

PMOS-FET 133 is essentially the same component as PMOS-FET 130. PMOS-FET 133 has 4 terminals—a gate terminal, a source terminal, a drain terminal, and a body terminal (or well contact). The body terminal is denoted with a "B" in the component diagram of PMOS-FET 133. For PMOS-FET 133, terminal B connects to a well, wherein the well is heavily doped with n-type material (i.e., electrons/electron rich carriers to facilitate conduction). In contrast, PMOS-FET 130 has a 3 terminals—a gate terminal (G), a source terminal (S), and a drain terminal (D). Both PMOS-FET 130 and PMOS-FET 133 have negative threshold voltages.

NMOS-FET 135 is a type of metal-oxide semiconductor field-effect transistor (MOSFET) used for amplifying and switch electronic signals. More specifically, NMOS-FET 130 is a n-channel MOSFET and thus uses electrons (as opposed to holes) for conduction. NMOS-FET 130 is a device containing three terminals connected to data inputs, other wires, other electronic components, and/or devices. These three terminals are: a gate terminal; a source terminal; and a drain terminal. Drain-to-source current flows (via an induced conducting channel) connects the source terminal to the drain terminal. The conductivity is varied by the electric field that is produced when a voltage is applied between the gate terminal and source terminal. The gate terminal is attached to a poly silicon surface. The source and drain terminals are connected to a silicon oxide surface using heavily doped n-type material (i.e., electrons/electron rich carriers to facilitate conduction). Electric currents leave the gate terminal and the drain terminal and arrive into the source terminal.

NMOS-FET 137 is essentially the same component as NMOS-FET 135. NMOS-FET 137 has 4 terminals—a gate terminal, a source terminal, a drain terminal, and a body terminal (or well contact). The body terminal is denoted with a "B" in the component diagram of NMOS-FET 137. For NMOS-FET 137, terminal B connects to a well, wherein the well is doped with p-type material (i.e., holes/electron deficient carriers to facilitate conduction). In contrast, NMOS-FET 135 has a 3 terminals—a gate terminal, a source terminal, and a drain terminal. Both NMOS-FET 135 and NMOS-FET 137 have positive threshold voltages.

Crossed wire 140 is used to illustrate crossed wires. Crossed wires are not joined wires. Joined wires are junction nodes which are illustrated as a darkened circle labeled as N1, N2, N3, etc. Combination 150 is a combination of wires, resistors, capacitors, transistor, etc. which is capable of outputting a voltage to the rest of the IC through terminal T(O). Combination 150 aims to simplify a circuit diagram by omitting specific structural details of electric components and illustrate those omitted specific structural details render an output to remaining components of the IC.

Silicon-based MOSFETs contain gate contact 160, oxide layer 165, multiple units of D/S contact 170, conducting channel 180, and p-Well junction 175. Gate contact 160 and D/S contact 170 are associated with the gate terminals and drain/source terminals of n-channel MOSFETS (e.g., NMOS-FET 135 and NMOS-FET 137), respectively. D/S contact 170 is a doped region containing charge carriers in the form of electrons which flow through conducting channel 180. More specifically, one unit of D/S contact 170 is connected to another unit of D/S contact 170 by channel 180. p-Well junction 175 is a region containing p-type silicon. Oxide layer 165 is typically silicon dioxide, which is a dielectric/insulator material equivalent to planar capacitor.

Diode 185 is a two-terminal electronic component which conducts primarily in one direction. The functions of diode 185 allow an electric current to pass in one direction while block electric current in the opposite direction. This unidirectional behavior is referred to rectification in order to convert alternating current (AC) to direct current (DC). Electric current moves from the anodic terminal—T(A)—to the cathodic terminal—T(C).

In this embodiment, voltage divider 210 and voltage divider 215 are passive linear circuits that produce an outputted voltage that is a fraction of an inputted voltage. For both voltage divider 210 and voltage divider 215, the inputted voltage is received through T(I) and the voltage is grounded through T(Gr). A grounding device (e.g., earth ground 115, digital/common ground 116, and chassis ground 117) is connected to T(Gr). This resulting outputting voltage, which is a fraction of an inputted voltage, is referred to as voltage division. The inputted voltage is distributed among the components of voltage dividers 210 and 215. Voltage divider 210 outputs a single voltage, which is a fraction of the inputted voltage, to the rest of the IC. In contrast to voltage divider 210, voltage divider 215 outputs two voltages, which are a fraction of the inputted voltage, to the rest of the IC.

Voltage divider 215 contains a first set of components and second set of components, connect to contact 220 and contact 222, respectively. These first set of components and second set of components are not shown in voltage divider 215. The first set of components (which is not equivalent to a second set of components) within voltage divider 215 receives the inputted total voltage through T(I), distributes the inputted total voltage, and sends the resulting voltage to contact 220, which is directly connected to the output terminal T(O). Contact 220 transfers the resulting outputted voltage (i.e., a fraction of an inputted total voltage) to the rest of the IC. The second set of components (which is not equivalent to the first set of components) within voltage divider 215 receives the inputted total voltage through T(I), distributes the inputted total voltage, and sends the resulting voltage to contact 222, which is directly connected to the input terminal T(O). Contact 222 transfers the resulting outputted voltage (i.e., a fraction of an inputted total voltage) to the rest of the IC. By virtue of different component setups connected to contact 220 and contact 222, the resulting voltage contained in contact 220 is not the same as the resulting voltage contained in contact 222.

Voltage source 225 is a two terminal device which can maintain a fixed voltage. An ideal voltage source 225 can maintain the fixed voltage independent of the load resistance or the output current. However, a real voltage source 225 cannot supply unlimited current. A fixed voltage drop is maintained across terminals T(−) and T(+).

Multiple units of the described components/devices above are denoted with A, B, C, etc. For example, three units of inverter 105 would be denoted as inverter 105A, inverter 105B, and inverter 105C.

Figure 2:
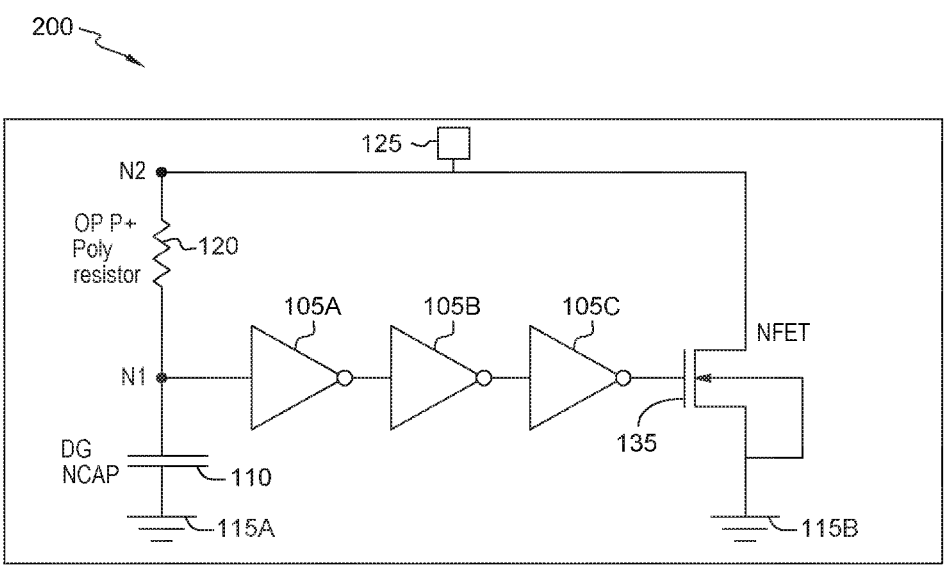
FIG. 2 is a block diagram of a RC clamp of an integrated circuit environment.

FIG. 2 is a block diagram of a RC clamp of an integrated circuit environment.

RC Clamp 200 contains a single layered clamping structure. RC clamp 200 contains inverters 105A-C; NMOS-FET 135; resistor 120; junction nodes—N1 and N2; Vdd 125; earth grounds 115A-B; and polarized capacitor 110. N1 is connected to the input terminal of inverter 105A, the first terminal of polarized capacitor 110, and the first terminal of resistor 120. N2 is connected to the second terminal of resistor 120 and the drain terminal of NMOS-FET 135. Earth ground 115A is connected to the second terminal of polarized capacitor 110 while earth ground 115B is connected to the source terminal of NMOS-FET 135. The output terminal of inverter 105A connects to the input terminal of inverter 105B. The output terminal of inverter 105B connects to the input terminal of inverter 105C. The output terminal of inverter 105C connects to the gate terminal of NFET 135.

For example, during the normal operation of RC clamp 200, the voltage at N1 is 2.5 V. the voltage between the output terminal of inverter 105A connected to the input terminal of inverter 105B is 0.0 V; the voltage between the output terminal of inverter 105B connected to the input terminal of inverter 105C is 2.5 V; the voltage between the output terminal of inverter 105C connected to the gate terminal of NMOS-FET 135 is 0.0 V; the voltage of the wire attached to Vdd 125 and N2 is 2.5 V. NMOS-FET 135 is turned off in this instance.

For example, during an ESD event of RC clamp 200, the voltage at N1 is 0.0 V; the voltage between the output terminal of inverter 105A connected to the input terminal of inverter 105B is 2.5 V; the voltage between the output terminal of inverter 105B connected to the input terminal of inverter 105C is 0.0 V; the voltage between the output terminal of inverter 105C connected to the gate terminal of NMOS-FET 135 is 2.5 V; the voltage of the wire attached to Vdd 125 and N2 is 0.0 V. NMOS-FET 135 is turned on in this instance. By stacking another FET similar to NMOS-FET 135 connected directly or indirectly to three inverter 105 units, a dually stacked BigFET circuit structure may be achieved to counteract ESD events. In other embodiments, fewer than or more than three inverter 105 units can be applied in the dually stacked BigFET circuit. A more detailed discussion of FET stacking to counteract ESD events will be provided with respect to the discussion of FIGS. 3-5, wherein the FET stacking is connected to a voltage dividers which sends two different voltages to the dually stacked BigFET circuit. One of these voltages is sent to the top layer of the RC clamp circuit and the other voltage is sent to the bottom layer of the RC clamp.

Figure 3:
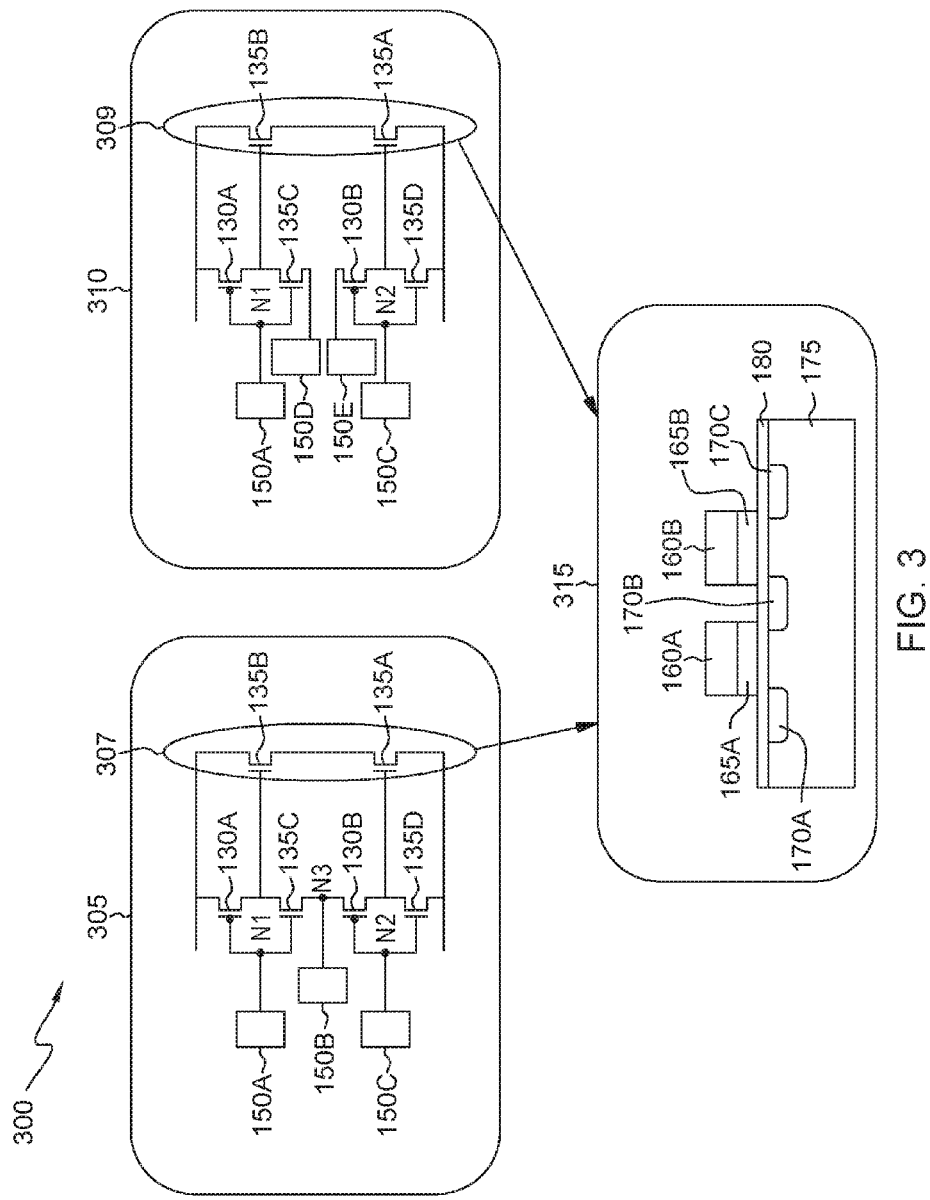
FIG. 3 is a functional block diagram of circuits and the transistor surface, in accordance with an embodiment of the present invention.

FIG. 3 is a functional block diagram of circuits and the transistor surface, in accordance with an embodiment of the present invention.

RC clamp environment 300 depicts a dual clamped IC in terms of a circuit schematic and transistor surface. Circuit schematic 310 is enabled by the present disclosure while circuit schematic 305 is not enabled by the present disclosure.

Circuit schematic 305 and circuit schematic 310 both contain stacked FETs in form of NMOS-FET 135A and NMOS-FET 135B connected directly to each other to counteract an ESD event. In the CMOS systems of these circuits, the drain terminal of the n-channel type FET connects to the drain terminal of the p-channel type FET. Also, circuit schematic 305 and circuit schematic 310 contain CMOS systems of: (i) PMOS-FET 130A and NMOS-FET 135C and (ii) PMOS-FET 130B and NMOS-FET 135D, which are connected directly to the terminal gate of NMOS-FET 135B and NMOS-FET 135A, respectively. In both circuit schematic 305 and circuit schematic 310, the gate terminals of: (i) PMOS-FET 130A and NMOS-FET 135C and (ii) PMOS-FET 130B and NMOS-FET 135D connect to N1 and N2, respectively. Combinations 150A and 150C feed voltage into N1 and N2, respectively.

Circuit schematic 305 represents circuit which is unable to balance voltages. In this instance, the BigFETs (i.e., NMOS-FET 135A and NMOS-FET 135B) or inverters (i.e., the CMOS systems of: (i) PMOS-FET 130A and NMOS-FET 135C and (ii) PMOS-FET 130B and NMOS-FET 135D) may become overstressed by combination 150B and N3. The voltages are not equally divided in circuit scheme 305. If combination 150B outputs one-half of an inputted voltage from a voltage supply pin (e.g., Vdd 125 as described above), then the voltage between the two Big-FETS (i.e., D/S contact 170B) is not one-half of the inputted voltage. If the output of combination 150B is adjusted, then some inverters are exposed to more than one-half the inputted voltage.

Circuit schematic 310 is able to balance received voltages from a power supply pin. In this instance, the BigFETs (i.e., NMOS-FET 135A and NMOS-FET 135B) or inverters (i.e., the CMOS systems of: (i) PMOS-FET 130A and NMOS-FET 135C and (ii) PMOS-FET 130B and NMOS-FET 135D) are not overstressed by omitting combination 150B and N3 and utilizing a voltage divider which facilitates the combinations 150D and 150E. In an exemplary, as described with respect to FIG. 5, combinations 150D and 150E comprises six p-channel type FETs (e.g., voltage divider 115). The voltage provided by combination 150D to the CMOS system of PMOS-FET 130A and NMOS-FET 135C is different from the voltage provided by the combination 150E to the CMOS system of PMOS-FET 130B and NMOS-FET 135D. In other words, as opposed to circuit scheme 305, the source terminal of NMOS-FET 135C receives a different voltage from the source terminal of PMOS-FET 130B.

Circuit schematic 305 differs from circuit schematic 310 in that: (i) circuit schematic 305 contains combination 150B and N3, wherein combination 150B and N3 are connected directly to each other; (ii) circuit schematic 310 does not contain combination 150B and N3; (iii) circuit schematic 310 contains combination 150D and combination 150E, wherein combination 150D is directly connected to the source terminal of NMOS-FET 135C and combination 150E is directly connected to the source terminal of PMOS-FET 130B; and (iv) circuit schematic 305 does not contain combination 150D and 150E. These differences lead to different voltages across the different regions of stacks 307 and 309. Stacks 307 and 309 is also known as the dually stacked FETS of BigFETs. By virtue of containing combination 150D and combination 150E, two different voltages are sent to the midpoint region. The midpoint region is the directly connected wire/area between NMOS-FET 135B and NMOS-FET 135A.

Stacks 307 and 309 can be visualized as transistor surface 315. Transistor surface 315 contains p-Well 175; conducting channel 180 which connects D/S contacts 170A, 170B, and 170C; gate contact 160A and oxide layer 165A as a first gate stack; and gate contact 160B and oxide layer 165B as a second gate stack. The first gate stack and the second gate stack are associated with the gate terminal regions of NMOS-FET 135A and NMOS-FET 135B, respectively. D/S contact 170A is associated with the drain region of NMOS-FET 135A. D/S contact 170C is associated with the source region of NMOS-FET 135B. D/S contact 170B (which is also referred to as a midpoint node) is associated with the drain terminal of NMOS-FET 135A and the source terminal of NMOS-FET 135B. The voltage division values resulting from combination 150B and N3 of circuit schematic 305 is different voltage division values from combinations 150D and 150E of circuit schematic 310.

In an example, circuit schematic 305, which is representative of a circuit that does not equally divide inputted voltages, receives an inputted voltage of 5.0 V from a voltage supply pin; a voltage of 5.0 V from combination 150A to N1; a voltage of 2.5 V from combination 150C to N2; and voltage of 2.5 V from combination 150B to N3. The inputted voltage from the voltage supply pin leads to a voltage of 5.0 V in D/S contact 170C. Gate contact 160A has a voltage of 0.0V; p-Well 175 has a voltage 0.0 V; D/S contact 170A has a voltage of 0.0 V; D/C contact 170B has a voltage of 2.2 V; and gate contact 160B has a voltage of 2.5 V by virtue of the following events: 5.0 V from combination 150A to N1 transferred to the CMOS system of PMOS-FET 130A and NMOS-FET 135C; 2.5 V from combination 150C to N2 transferred to the CMOS system of PMOS-FET 130B and NMOS-FET 135D; and 2.5 V from combination 150C transferred to N3. While the voltage of gate contact 160B is indeed one half of the voltage of D/S contact 170C (i.e., the inputted voltage from Vdd 125), the voltage of D/S contact 170B is lower than one half of the voltage of D/S contact 170C.

In summary, circuit scheme 305 has obtained an inputted voltage from a power supply pin (e.g., 5.0 V), and the arrangement of electronic components in conjunction with the single voltage transferred from component 150B (e.g. 2.5 V), leads to a voltage of less than one half of the inputted voltage from the power supply pin (e.g., 2.2 V) in D/S contact 170B. Thus, voltages are not balanced out upon voltage division. The voltage of the midpoint node (e.g., D/S contact 170B) is not half of the inputted voltage from the power supply pin. Thus, voltage has been lost. This is merely an example, as inputted voltages aside from 5.0 V deriving from the voltage supply pin can be transferred to the CMOS system of PMOS-FET 130A and NMOS-FET 135C.

In an exemplary embodiment, circuit schematic 310, which is able to divide voltage equally, receives an inputted voltage of 5.0 V from a voltage supply pin; a voltage of 5.0 V from combination 150A to N1; a voltage of 2.5 V from combination 150C to N2; a voltage of 2.8 V from combination 150D to the source terminal of NMOS-FET 135C; and a voltage of 2.5 V from combination 150E to the source terminal of PMOS-FET 130B. The inputted voltage from the voltage supply pin leads to a voltage of 5.0 V in D/S contact 170C. Gate contact 160A has a voltage of 0.0V; p-Well 175 has a voltage 0.0 V; D/S contact 170A has a voltage of 0.0 V; D/C contact 170B has a voltage of 2.5 V; and gate contact 160B has a voltage of 2.8 V by virtue of the following events: 5.0 V from combination 150A to N1 transferred to the CMOS system of PMOS-FET 130A and NMOS-FET 135C; 2.5 V from combination 150C to N2 transferred to the CMOS system of PMOS-FET 130B and NMOS-FET 135D; 2.8 V from combination 150D transferred to the source terminal of NMOS-FET 135C; and 2.5 V from combination 150E transferred to the source terminal of PMOS-FET 130B. While the voltage of gate contact 160B is greater than one half of the voltage of D/S contact 170C (i.e., the inputted voltage from Vdd 125), the voltage of D/S contact 170B is one half of the voltage of D/S contact 170C. In this exemplary embodiment, the voltages, as transferred from combinations 150D and 150E to NMOS-FET 135B and NMOS-FET 135A, are obtained by using voltage divider 215.

In summary, circuit scheme 310 has obtained an inputted voltage from a power supply pin (e.g., 5.0 V), and the arrangement of electronic components in conjunction with the two voltages transferred from components 150D and 150E (e.g., 2.8 V and 2.5 V, respectively), leads to a voltage one half of the inputted voltage from the power supply pin (e.g., 2.5 V) in D/S contact 170B. In the above exemplary embodiment, the voltages, as transferred from combinations 150D and 150E to NMOS-FET 135B and NMOS-FET 135A, are obtained by using voltage divider 215. Thus, voltages are balanced out upon voltage division. The voltage of the midpoint node (e.g., D/S contact 170B) is half of the inputted voltage from the power supply pin. This exemplary embodiment is merely an example, as inputted voltages aside from 5.0 V deriving from the voltage supply pin can be transferred to the CMOS system of PMOS-FET 130A and NMOS-FET 135C.

The resulting voltages in stack 307 and 309 derive from circuit scheme 305 and circuit scheme 310, respectively demonstrate the criticality of a voltage divider resembling voltage divider 215. The voltage divider balances voltages upon voltage division by providing a first voltage to the top row of inverters connected to a first BigFET and a second voltage of the bottom row of inverters connected to a second BigFET, wherein the first voltage is not equal to the second voltage.

Figure 4:
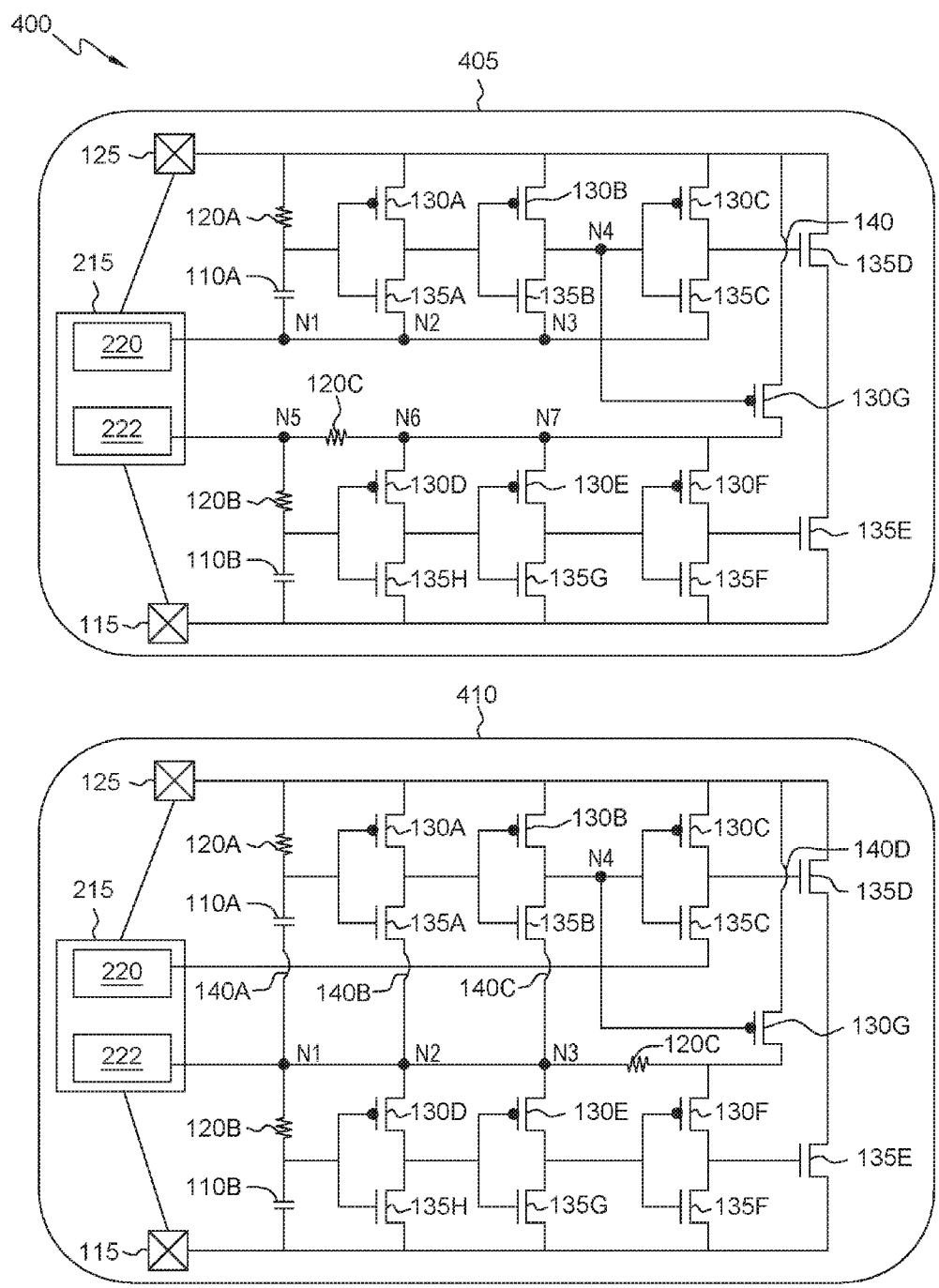
FIG. 4 is a schematic circuit diagram of a dual-clamped circuit designed to balance out the voltage drop across two field-effect transistors, in accordance with an embodiment of the present invention.

FIG. 4 is a schematic circuit diagram of a dual-clamped circuit designed to balance out the voltage drop across two field-effect transistors, in accordance with an embodiment of the present invention.

Circuitry environment 400 contains circuits 405 and 410, which depict the arrangement of FETs and other components to balance out the inputted voltage from a voltage supply pin during voltage division.

Both circuits 405 and 410 are dual clamped RC clamp circuits. A first clamp is the top row of inverters and a second clamp is the bottom row of inverters. Each row of inverters is connected to a BigFET. Additionally, both circuits 405 and 410 contain: voltage dividers which provide a first voltage to the top row of inverters (e.g., PMOS-FET 130A/NMOS-FET 135A; PMOS 130B/NMOS-FET 135B; and PMOS-FET 130C/NMOS-FET 135C) and a second voltage to the bottom row of inverters (e.g., PMOS-FET 130D/NMOS-FET 135H; PMOS 130E/NMOS-FET 135G; and PMOS-FET 130F/NMOS-FET 135F); three resistors (e.g., resistors 120A-C); (iii) a capacitor (e.g., polarized capacitors 110A-B); a voltage supply pin (e.g., Vdd 125); a ground (e.g., ground 115); and an additional FET (e.g., PMOS-FET 130G) which powers the bottom row of inverters. Inverters are CMOS systems containing a single PMOS FET and a single NMOS FET. Each inverter can also be describe as having a source node/region that connects to the source terminal of a PMOS FET; an input region that connects to the gate terminals of a PMOS FET and a NMOS FET; an output region that connects to the drain terminals of a PMOS FET and the drain of the NMOS FET; and a voltage grounding region that connects to the source terminal of NMOS FET.

Circuit 405 contains seven nodes (N1-N7) and six inverters. Vdd 125 supplies voltage to voltage divider 215 while ground 115 grounds the voltage for voltage divider 215. Contact 220 of voltage divider 215 is connected to N1, N2, and N3 on a wire. In the top row, polarized capacitor 110A connects to resistor 120A and N1. The first inverter is the CMOS system of PMOS-FET 130A and NMOS-FET 135A, which connects to N2 at the source terminal of NMOS-FET 135A and the gate terminals of PMOS-FET 130B and NMOS-FET 135B. The second inverter is the CMOS system of PMOS-FET 130B and NMOS-FET 135B, which connects to N3 at the source terminal of NMOS-FET 135B and the gate terminals of PMOS-FET 130C and NMOS-FET 135C. The third inverter is the CMOS system of PMOS-FET 130C and NMOS-FET 135C, which connects to the gate terminal of NMOS-FET 135D (i.e., the first FET of the two BigFETs) and contact 220. The source terminal of PMOS-FET 130G is connected to crossed wire 140; the gate terminal of PMOS-FET 130G is connected to N4, which is connected to the second inverter and the third inverter; and the drain terminal of PMOS-FET 130G is connected to the bottom of inverters—the fourth inverter, the fifth inverter, and the sixth inverter. Contact 222 of voltage divider 215 is connected to N5, N6, and N7 on a wire. In the bottom row, resistor 120B connects to polarized capacitor 110B and N5 while resistor 120C connects to N5 and N6. The fourth inverter is the CMOS system of PMOS-FET 130D and NMOS-FET 135H, which connects to N6 at the source terminal of PMOS-FET 130D and the gate terminals PMOS-FET 130E and NMOS-FET 135G. The fifth inverter is the CMOS system of PMOS-FET 130E and NMOS-FET 135G, which connects to N7 at the source terminal of PMOS-FET 130E and gate terminals of PMOS-FET 130F and NMOS-FET 135F. The sixth inverter is the CMOS system of PMOS-FET 130F and NMOS-FET 135F, which connects to the gate terminal of NMOS-FET 135E (i.e., the second FET of the two Big-FETs). The source terminal of NMOS-FET 135D connects to the drain terminal of NMOS-FET 135E.

Circuit 410 contains four nodes (N1-N4) and six inverters. Vdd 125 supplies voltage to voltage divider 215 while ground 125 grounds the voltage for voltage divider 215. Contact 220 of voltage divider 215 is connected a wire which goes through crossed wires 140A-D, which are crossed wires. In the top row, polarized capacitor 110A connects to resistor 120A and crossed wire 140A. The first inverter is the CMOS system of PMOS-FET 130A and NMOS-FET 135A, which connects to crossed wire 140B at the source terminal of NMOS-FET 135A and the gate terminals PMOS-FET 130B and NMOS-FET 135B. The second inverter is the CMOS system of PMOS-FET 130B and NMOS-FET 135B, which connects to crossed wire 140C at the source terminal of NMOS-FET 135B and the gate terminals of PMOS-FET 130C and NMOS-FET 135C. The third inverter is the CMOS system of PMOS-FET 130C and NMOS-FET 135C, which connects to the gate terminal of NMOS-FET 135D (i.e., the first FET of the two BigFETs) and contact 220. The source terminal of PMOS-FET 130G is connected to crossed wire 140D; the gate terminal of PMOS-FET 130G is connected to N4, which is connected to the second inverter and the third inverter; and the drain terminal of PMOS-FET 130G is connected the bottom of inverters. Component 222 of voltage divider 215 is connected to N1, N2, and N3 on a wire. In the bottom row—the fourth inverter, the fifth inverter, and the sixth inverter—resistor 120B connects to polarized capacitor 110B and N1 while resistor 120C connects to N3 and the drain terminal of PMOS-FET 130G. The fourth inverter is the CMOS system of PMOS-FET 130D and NMOS-FET 135H, which connects to N2 at the source terminal of PMOS-FET 130D and the gate terminals PMOS-FET 130E and NMOS-FET 135G. The fifth inverter is the CMOS system of PMOS-FET 130E and NMOS-FET 135G, which connects to N3 at the source terminal of PMOS-FET 130E and gate terminals of PMOS-FET 130F and NMOS-FET 135F. The sixth inverter is the CMOS system of PMOS-FET 130F and NMOS-FET 135F, which connects to the gate terminal of NMOS-FET 135E (i.e., the second FET of the two BigFETs). The source terminal of NMOS-FET 135D connects to the drain terminal of NMOS-FET 135E.

In this embodiment, to balance out voltages during voltage division, contact 220 must be connected to the third invertor (i.e., the CMOS system of PMOS-FET 130C and NMOS-FET 135C) in circuits 405 and 410. The direct connection of contact 220 to the third invertor, as opposed to other types of connectivity to other components, facilitates the transfer of voltage in contact 220 to the top inverters. FIGS. 6-9 illustrate the influence of the direct connection of contact 220 to the third inverter on voltages in circuits similar to circuits 405 and 410. However, the first inverter (i.e., the CMOS system of PMOS-FET 130A and NMOS-FET 135A) and the second inverter (i.e., the CMOS system of PMOS-FET 130B and NMOS-FET 135B) can be connected to contact 220 instead of contact 220 (as pictured in FIG. 4). During an ESD event, PFET-MOS 130G, of circuits 405 and 410, powers the bottom inverters—the fourth inverter (i.e., the CMOS system of PMOS-FET 130D and NMOS-FET 135H); the fifth inverter (i.e., the CMOS system of PMOS-FET 130E and NMOS-FET 135G); and the sixth inverter (i.e., the CMOS system of PMOS-FET 130F and NMOS-FET 135F). Furthermore, the bottom inverters are powered by the voltage supplied by Vdd 125 as opposed to a fraction of the voltage supplied by Vdd 125. During the typical/normal operation, contact 222 and resistor 120C, of circuits 405 and 410, powers the bottom inverters—the fourth inverter (i.e., the CMOS system of PMOS-FET 130D and NMOS-FET 135H); the fifth inverter (i.e., the CMOS system of PMOS-FET 130E and NMOS-FET 135G); and the sixth inverter (i.e., the CMOS system of PMOS-FET 130F and NMOS-FET 135F). In circuits 405 and 410, divider 215 divides the shared supply of voltage of the inverters into two separate nodes.

Figure 5:
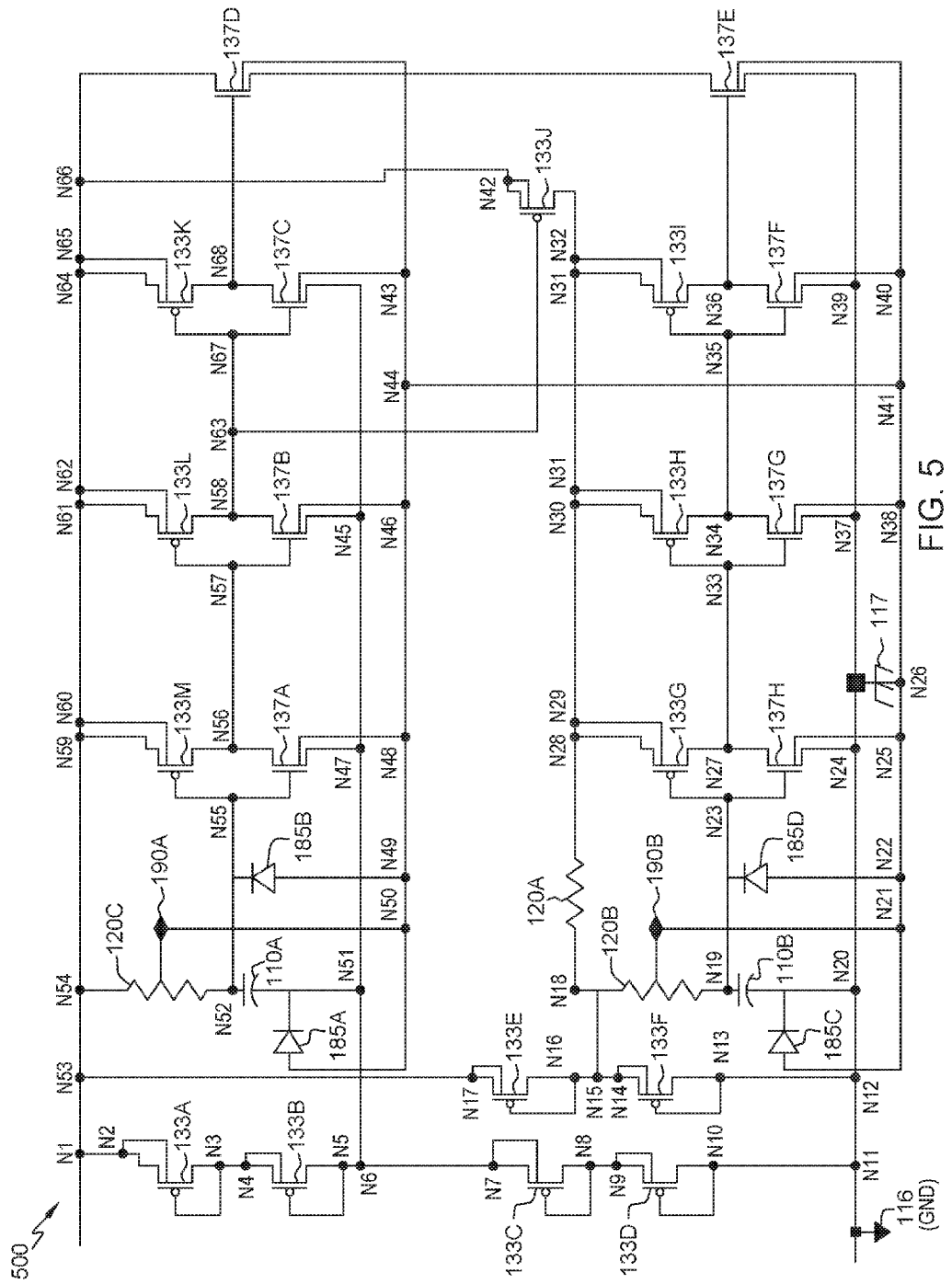
FIG. 5 is a circuit diagram depicting the design of the voltage dividers and clamps, in accordance with an embodiment of the present invention.

FIG. 5 is a circuit diagram depicting the design of the voltage dividers and clamps, in accordance with an embodiment of the present invention.

Circuit design 500 is a full circuit schematic of a dual-stacked RC clamp circuit. More specifically, circuit design 500 is a more detailed depiction of circuit 405. The regions of circuit design 500 include: (i) the voltage divider; (ii) the top layer; (iii) the bottom layer; and (iv) an additional FET. These regions are described in greater detail below. During normal operation, with circuit design 500, the discharging FETs experience lower drain-to-source voltage ($V_{ds}$) than with the previously reported circuits. A lower $V_{ds}$ leads to fewer non-conducting hot electrons and more stable threshold voltage. Hot electrons may increase voltage imbalances during voltage division and increase voltage leakage. By virtue of fewer hot electrons as enabled by circuit design 500, there are fewer voltage imbalances during voltage division. During an ESD event, the inverters of the bottom layer of circuit design 500 is the supplied with the voltage of Vdd 125 (as opposed to half of the supplied voltage of Vdd 125) while leaving the voltage of the midpoint region balanced. Vdd 125 is not depicted in FIG. 5. In turn, this enables the bottom inverters to: turn on faster; clamp the ESD voltage to a lower value; reduce peak voltage; and reduce the overshoot time.

The voltage divider of circuit design 500 contains PMOS-FETs 133A-F. PMOS-FET 133A is connected to: N2, through the source and body terminals of PMOS-FET 133A; and N3, through the gate terminal of PMOS-FET 133A and the drain terminal of PMOS-FET 133A. N1 is also connected to N53 and N2. PMOS-FET 133B is connected to: N4, through the source and body terminals of PMOS-FET 133B; N5, through the gate terminal of PMOS-FET 133B and drain terminal PMOS-FET 133B. N6 is connected to N51 and N7. PMOS-FET 133C is connected to: N7, through the source and body terminals of PMOS-FET 133C, and N8, through the gate terminal of PMOS-FET 133C, and the drain terminal PMOS-FET 133C. PMOS-FET 133D is connected to: N9, through the source and body terminals of PMOS-FET 133D; and N10, through the gate terminal of PMOS-FET 133D, and drain terminal PMOS-FET 133D. N11 is connected to digital/common ground 116, N10, and N12. PMOS-FET 133E is connected to: N17, through the source and body terminals of PMOS-FET 133E; and N16, through the gate terminal of PMOS-FET 133E, and drain terminal PMOS-FET 133E. N17 is also connected to N53. PMOS-FET 133F is connected to: N14, through the source and body terminals of PMOS-FET 133F; and N13, through the gate terminal of PMOS-FET 133F, and drain terminal PMOS-FET 133F. N12 is also connected to N11, N13, and N20. The voltage divider, as setup in circuit design 500, transfers separate supplies of voltage while enabling the midpoint region to receive a voltage that is half of the supplied total voltage. The separate supplies of the voltage are sent to the top layer and the bottom layer of the circuit. The top layer receives a voltage of 2.8 V from the voltage divider along N6 to N51. The bottom layer receives a voltage of 2.5 V from the voltage divider along N15 to N18.

The top layer of circuit design 500 contains polarized capacitor 110A; resistor 120C; diodes 185A-B; PMOS-FETs 133K, 133L, and 133M; and NMOS-FETs 137A-D. N52 connects to N55; N56 connects to N57; and N58 connects to N63. The anodic terminal of diode 185A connects to polarized capacitor 110A, which is connected to N52 and N51. The terminals of resistor 120C, which is attached to well 190A, are connected to N54 and N52. N50 connects to well 190A. N49 connects to the anodic terminal of diode 185B. The first inverter is a CMOS system of PMOS-FET 133M and NMOS-FET 137A, which connects to: (i) N55 at the gate terminals of PMOS-FET 133M and NMOS-FET 137A; (ii) N56 at the drain terminals of PMOS-FET 133M and NMOS-FET 137A; (iii) N59 and N60 at the source terminal and body terminal of PMOS-FET 133M, respectively; and (iv) N47 and N48 at the source terminal and body terminal of NMOS-FET 137A, respectively. The second inverter is a CMOS system of PMOS-FET 133L and NMOS-FET 137B, which connects to: (i) N57 at the gate terminals of PMOS-FET 133L and NMOS-FET 137B; (ii) N58 at the drain terminals of PMOS-FET 133L and NMOS-FET 137B; (iii) N61 and N62 at the source terminal and body terminal of PMOS-FET 133M, respectively; and (iv) N45 and N46 at the source terminal and body terminal, of NMOS-FET 137B, respectively. The third inverter is a CMOS system of PMOS-FET 133K and NMOS-FET 137C, which connects to: (i) N67 at the gate terminals of PMOS-FET 133K and NMOS-FET 137C; (ii) N68 at the drain terminals of PMOS-FET 133K and NMOS-FET 137C; (iii) N64 and N65 at the source terminal and body terminal of PMOS-FET 133K, respectively; and (iv) N43 and to the wire containing N6, N51, N47, N45 (which transfer voltage to the third inverter) at the body terminal and the source terminal of NMOS-FET 137C, respectively. At N68, the third inverter connects to the gate terminal of NMOS-FET 137D (i.e., the first FET of the two BigFETs). The drain terminal of NMOS-FET 137D connects to N66 and the source terminal of NMOS-FET 137D connects to the drain terminal of NMOS-FET 137E (i.e., the second FET of the two BIGFets) of the bottom layer. N44 connects to N46 of the top layer, N43 of the top layer, and N41 of the bottom layer.

The bottom layer of circuit design 500 contains polarized capacitor 113B; resistor 120A-B; diodes 185C-D; chassis ground 117; PMOS-FETs 133G, H, and I; and NMOS-FETs 137E-H. Resistor 120A is a decoupling agent, which provides 1 Kohm to 1 Mohm of resistance and can be replaced by another unit of diode 185, wherein the anodic terminal of diode 185 faces the RC clamp. Resistor 120A, which may vary in size, provides the required 1 Kohm and 1 Mohm of resistance. In conjunction with the required resistance, resistor 120A is: (i) small enough in size so that the voltage divider region, as described above, can supply the three invertors of the bottom layer during a normal operation; and (ii) large enough in size as to restrict the influence of the voltage divider region during an ESD event when PMOS-FET 133J is turned on. The terminals of resistor 120A are connected to N18 and N28. N19 connects to N23; N27 connects to N33; and N34 connects to N35. The anodic terminal of diode 185C connects to polarized capacitor 110B, which is connected to N20 and N19. The terminals of resistor 120B, which is attached to well 190B, are connected to N18 and N19. N21 is connected to well 190B. N22 connects to the anodic terminal of diode 185D. The fourth inverter is a CMOS system of PMOS-FET 133G and NMOS-FET 137H, which connects to: (i) N23 at the gate terminals of PMOS-FET 133G and NMOS-FET 137H; (ii) N27 at the drain terminals of PMOS-FET 133G and NMOS-FET 137H; (iii) N28 and N29 at the source terminal and body terminal of PMOS-FET 133G, respectively; and (iv) N24 and N25 at the source terminal and body terminal of NMOS-FET 137H, respectively. Chassis ground 117 connects to N26, wherein N26 is connected to N25 and N38. The fifth inverter is a CMOS system of PMOS-FET 133H and NMOS-FET 137G, which connects to: (i) N33 at the gate terminals of PMOS-FET 133H and NMOS-FET 137G; (ii) N34 at the drain terminals of PMOS-FET 133H and NMOS-FET 137G; (iii) N30 and N31 at the source terminal and body terminal of PMOS-FET 133H, respectively; and (iv) N37 and N38 at the source terminal and body terminal of NMOS-FET 137G, respectively. The sixth inverter is a CMOS system of PMOS-FET 133I and NMOS-FET 137F, which connects to: (i) N35 at the gate terminals of PMOS-FET 133I and NMOS-FET 137F; (ii) N36 at the drain terminals of PMOS-FET 133I and NMOS-FET 137F; (iii) N31 and N32 at the source terminal and body terminal of PMOS-FET 133I, respectively; and (iv) N39 and N40 at the source terminal and body terminal of NMOS-FET 137F, respectively. At N36, the sixth inverter connects to the gate terminal of NMOS-FET 137E (i.e., the second FET of the two BigFETs). The drain terminal of NMOS-FET 137E connects to the source terminal of NMOS-FET 137D (i.e., the first FET of the two BIGFets) of the top layer. N41 connects to N38 of the bottom layer, N40 of the bottom layer, and N44 of the top layer.

PMOS-FET 133J is a component which further bridges the top layer and bottom layer together. PMOS-FET 133J turns on during an ESD event to power the bottom inverters (i.e., the fourth, fifth, and sixth inverters). Powering the bottom inverters speeds up the performance of the bottom inverters, which in part biases NMOS-FET 137E to the supplied total voltage ($V_D$) instead of $V_D/2$. Biasing NMOS-FET 137E to $V_D$ enables better clamping. At the gate terminal of PMOS-FET 133J, the top layer is connected at N63. At the source terminal of PMOS-FET 133J, the top layer is connected at N66 and N42. At the drain terminal of PMOS-FET 133J, the bottom layer is connected at N32.

Figure 6:
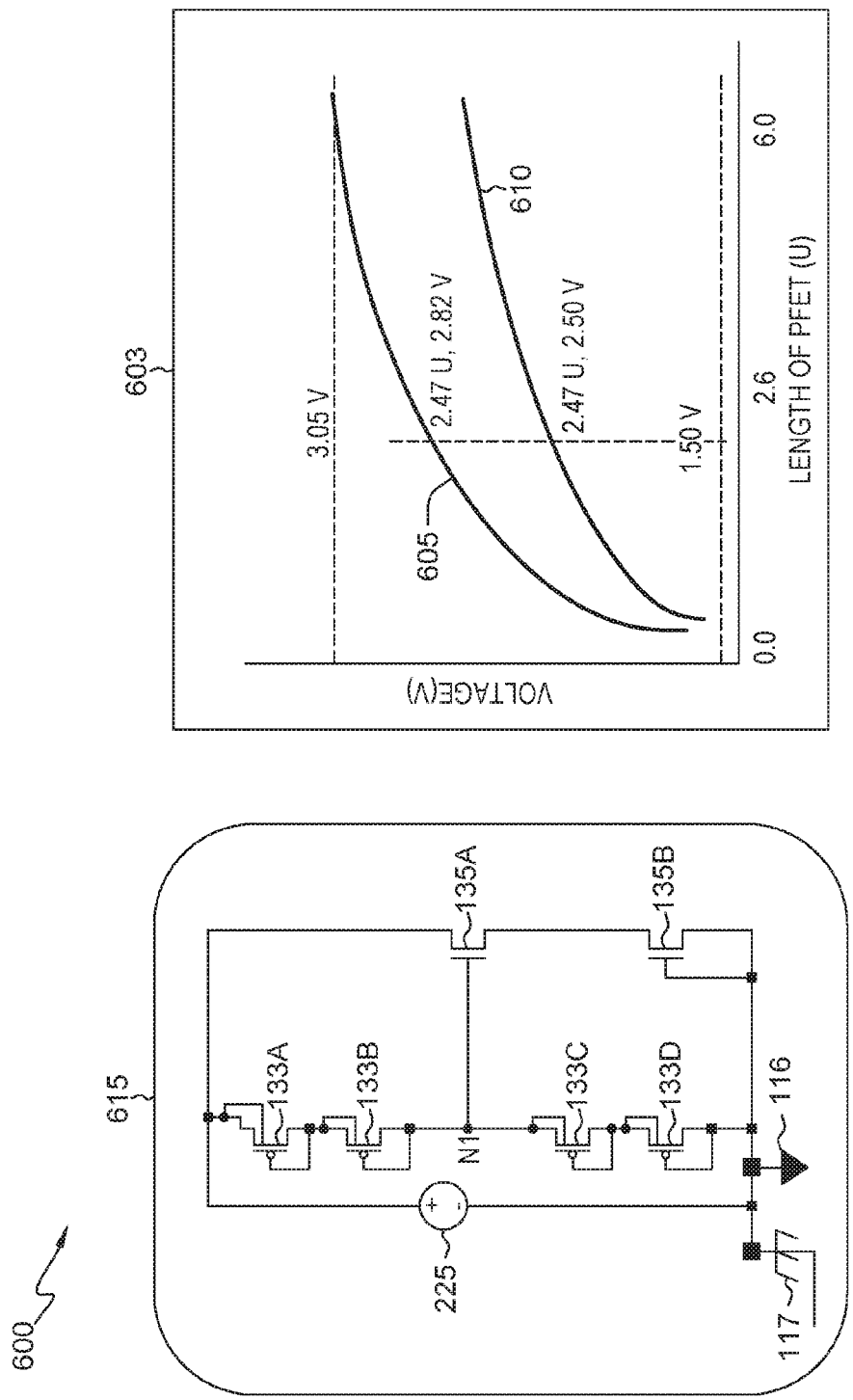
FIG. 6 is a plot of voltage as a function of the length of a p-channel FET, in accordance with an embodiment of the present invention.

FIG. 6 is a plot of voltage as a function of the length of a p-channel FET, in accordance with an embodiment of the present invention.

Circuit environment 600 is represented by circuit 615 and graph 603.

Circuit 615 is a simplified model of circuit 405, circuit 410, and circuit design 500, in order to demonstrate the voltages of BigFETs—NMOS-FETs 135A and 135B can be balanced by shifting the divided voltage. Voltage source 225 supplies the inputted voltage at $V_D$; and ground 116 and chassis ground 117 ground the voltage of circuit 615. Furthermore, circuit 615 contains PMOS-FETs 133A, 133B, 133C, and 133D. The top layer FETs—PMOS-FETs 133A and 133B—maintain the same length of 0.32 micrometers and transfer a voltage greater than $V_D/2$ to N1. This transferred (and divided) voltage—$V_{DIV}$—resides on a wire connecting N1 to the gate terminal of NMOS-FET 135A. The midpoint voltage ($V_{MID}$) resides between the source terminal of NMOS-FET 135A and drain terminal of NMOS-FET 135B. $V_{MID}$ is influenced by the variation of length of bottom layer FETs—PMOS-FETs 133C and 133D—and the wire connecting N1 to the gate terminal of NMOS-FET 135A containing $V_{DIV}$.

Plot 603 is graphical representation of voltage as a function of the length of PFET. Curve 605 is associated with $V_{DIV}$, which resides on a wire connecting N1 to the gate terminal of NMOS-FET 135A. Curve 610 is associated with $V_{MID}$, which resides between the source terminal of NMOS-FET 135A and drain terminal of NMOS-FET 135B. Increasing the length to 2.47 micrometers of the bottom layer FETS—PMOS-FETs 133C and 133D—enables $V_{DIV}$=2.82 V on curve 605 and $V_{MID}$=2.50 V on curve 610. These are the voltages achieved in the actual circuit—circuit design 500. As observed in curve 605, the voltage from N6 to N51 in FIG. 5 is 2.82 V and as observed in curve 610, the voltage from N15 to N18 in FIG. 5 is 2.50 V.

Figure 7:
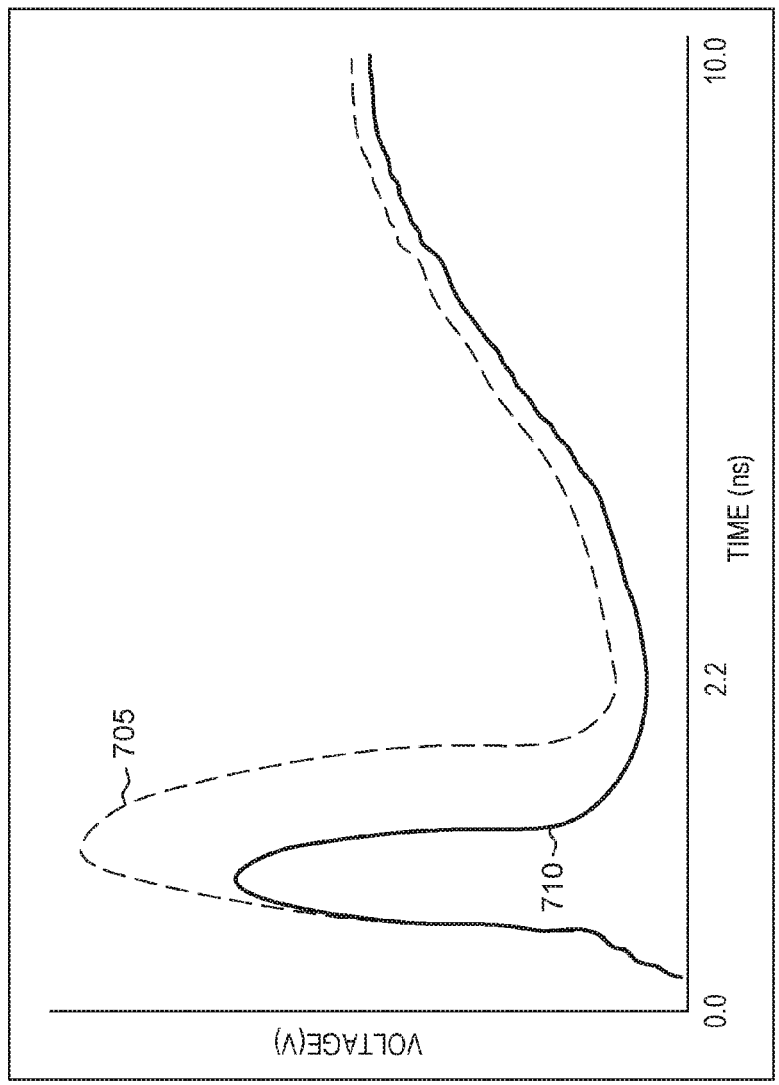
FIG. 7 is a plot depicting voltage waveforms, in accordance with an embodiment of the present invention.

FIG. 7 is a plot depicting voltage waveforms, in accordance with an embodiment of the present invention.

Graph 700 depicts voltage waveforms, where voltage is plotted as a function of time. Curve 705 is associated with previously reported devices and curve 710 is associated with circuit design 500 of this disclosure. Curve 710 depicts a circuit which experiences a peak voltage faster than curve 710 and has a lower peak voltage than curve 705, which is 10% lower and 40% narrower than the peak of curve 705. These results are attributed to the bottom layer of circuit design 500, which is associated with curve 710. The bottom layer of circuit design 500 is supplied with higher voltage than the corresponding components of previously reported devices, which are associated with curve 710.

Figure 8:
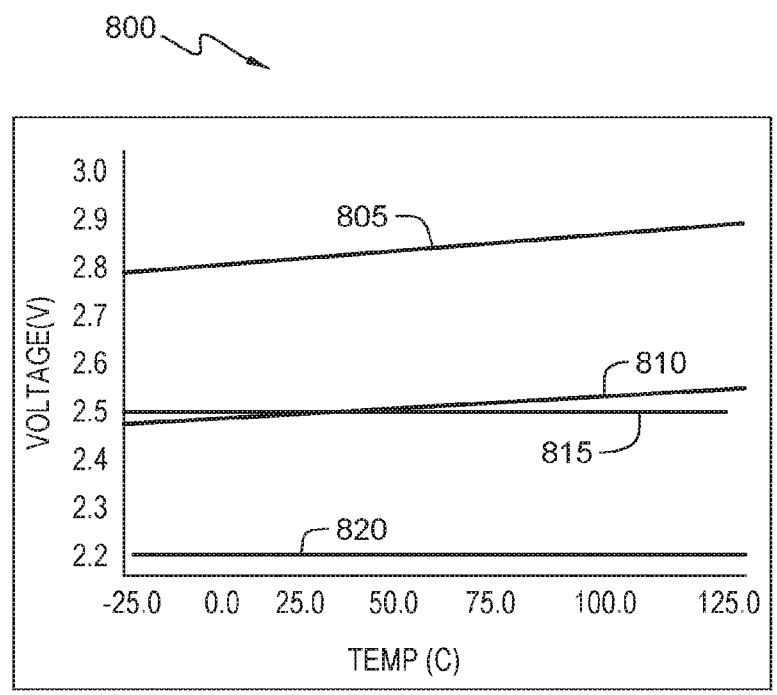
FIG. 8 is a plot depicting voltage as a function of temperature, in accordance with an embodiment of the present invention.

FIG. 8 is a plot depicting voltage as a function of temperature, in accordance with an embodiment of the present invention.

Graph 800 depicts a plot of voltage as a function of temperature. Line 815 represents a device which exhibits a constant voltage of 2.5 V and line 820 represents previously reported devices which exhibit a voltage of 2.2 V, as the temperature increases. Line 805 and line 810 represent the voltage of N5 of circuit design 500 and the voltage from the node between the two BigFETs 137D and 137E of circuit design 500, respectively. Line 805 exhibits voltages below 2.8 V at lower temperatures, reaches a voltage of 2.82 V, as observed from N6 to N51 of circuit design 500, and continues to linearly increase in voltage as the temperature rises. Line 810 exhibits voltages below 2.5 V at lower temperatures, reaches a voltage of 2.50 V, as observed from N15 to N18 of circuit design 500, and continues to linearly increase in voltage as the temperature rises. In another embodiment, a resistive divider may solve the temperature sensitivity of circuit design 500 from the voltage divider (e.g., voltage divider 215). These results are DC simulations.

Figure 9:
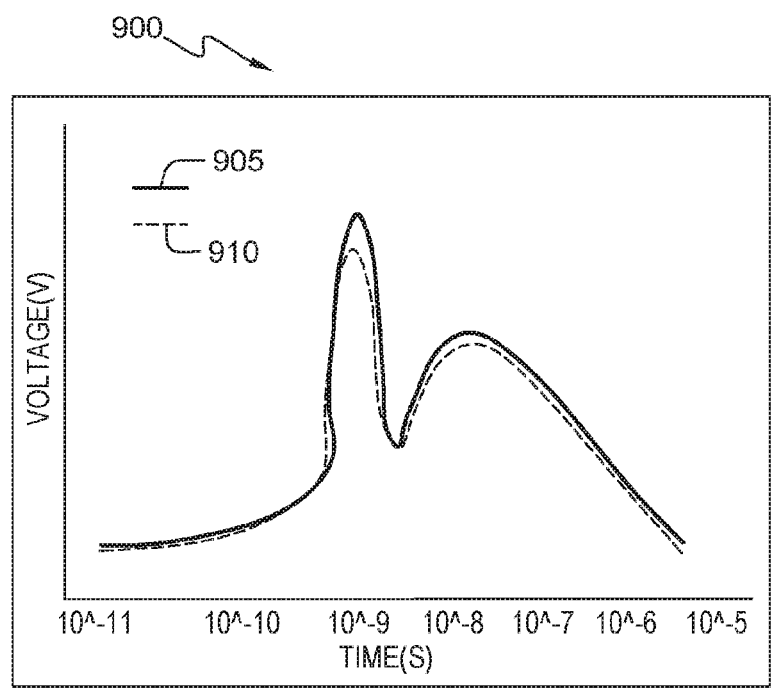
FIG. 9 is a plot depicting voltage as a function of time, in accordance with an embodiment of the present invention.

FIG. 9 is a plot depicting voltage as a function of temperature, in accordance with an embodiment of the present invention.

Graph 900 depicts a plot of voltage as a function of time. Curve 905 represents the previously reported devices and curve 910 represents circuit design 500. Curve 910 achieves the first peak voltage at the onset of a pulse faster and lower first peak voltage than curve 905. This is indicative of that circuit design 500 is better at clamping in response of a pulse than the previously reported devices. These results are ESD simulations. The ESD simulations have been performed using human body models (HBMs), machine models (MMs), and charged device models (CDMs), as understood in the art. Voltage levels and peak current magnitudes may vary depending on the model used. HBM, MM, and CDM simulate human discharging through a chip, metal tool discharging through a chip, and charged chip discharging to ground, respectively. An equivalent circuit, discharge path, discharge waveform, on-chip characteristics, and failure mechanisms are other attributes factored into HBMs, MMs, and CDMs.

What is claimed is:

1. A method for balancing out voltages, comprises:
receiving a total voltage from a voltage supply pin;
dividing the total voltage into two different voltages, wherein:
a first voltage is greater than half of the total voltage, and
a second voltage is less than or equal to half of the total voltage;
sending the first voltage to a group of inverters of a first layer and an n-type channel field effect transistor (NFET) of the first layer, wherein the group of inverters of the first layer consists of: a first inverter, a second inverter, and a third inverter;
sending the second voltage to a decoupling resistor, and a group of inverters of a second layer, and an NFET of the second layer, wherein the group of inverters of the second layer consists of: a first inverter, a second inverter, and a third inverter;
responsive to sending the first voltage and the second voltage, powering the first inverter, the second inverter, and the third inverter of the second layer through the decoupling resistor during a typical operation of a circuit;
monitoring for an electric static discharge (ESD) event;
responsive to detecting an ESD event powering the first inverter, the second inverter, and the third inverter of the second layer through a first p-type channel field effect transistor (PFET) during the ESD event; and
generating a third voltage at a midpoint node, wherein the third voltage is half of the total voltage during the ESD event and wherein the midpoint node is a common region shared between the NFET of the first layer and the NFET of the second layer.

* * * * *